(12) United States Patent
Fujita et al.

(10) Patent No.: US 8,514,903 B2
(45) Date of Patent: *Aug. 20, 2013

(54) QUANTUM CASCADE LASER

(75) Inventors: Kazuue Fujita, Hamamatsu (JP);
Tadataka Edamura, Hamamatsu (JP);
Tatsuo Dougakiuchi, Hamamtsu (JP)

(73) Assignee: Hamamatsu Photonics K.K.,
Hamamatsu-shi, Shizuoka (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/110,687

(22) Filed: May 18, 2011

(65) Prior Publication Data

US 2011/0286486 A1 Nov. 24, 2011

Related U.S. Application Data

(60) Provisional application No. 61/346,159, filed on May 19, 2010.

(30) Foreign Application Priority Data

May 19, 2010 (JP) ................ P2010-115186

(51) Int. Cl.
*H01S 5/00* (2006.01)
(52) U.S. Cl.
USPC .................................... 372/45.01
(58) Field of Classification Search
USPC ............... 257/22, 13; 372/46.01, 46.012; 438/357

See application file for complete search history.

(56) References Cited

U.S. PATENT DOCUMENTS

| 5,457,709 | A | * | 10/1995 | Capasso et al. ........... 372/45.01 |
| 5,509,025 | A | | 4/1996 | Capasso et al. |
| 5,745,516 | A | | 4/1998 | Capasso et al. |
| 6,751,244 | B2 | | 6/2004 | Faist et al. |

(Continued)

FOREIGN PATENT DOCUMENTS

| JP | 8-279647 | 10/1996 |
| JP | 10-4242 | 1/1998 |

(Continued)

OTHER PUBLICATIONS

U.S. Office Action dated Mar. 14, 2012 that issued in U.S. Appl. No. 12/919,289 including Double Patenting Rejections on pp. 3-5.

(Continued)

*Primary Examiner* — Tod T Van Roy
*Assistant Examiner* — Tuan Nguyen
(74) *Attorney, Agent, or Firm* — Drinker Biddle & Reath LLP

(57) ABSTRACT

A quantum cascade laser includes a semiconductor substrate, and an active layer having a cascade structure formed by multistage-laminating unit laminate structures each including an emission layer and an injection layer. Further, the unit laminate structure 16 includes a first emission upper level, a second emission upper level, and a plurality of emission lower levels, one of the first and second upper levels is a level arising from a ground level in the first well layer, and the other is a level arising from an excitation level in the well layer except for the first well layer. Further, the energy interval between the first upper level and the second upper level is set smaller than the energy of an LO phonon, and the energy interval between the second upper level and a higher energy level is set larger than the energy of an LO phonon.

6 Claims, 12 Drawing Sheets

(56) References Cited

U.S. PATENT DOCUMENTS

| | | |
|---|---|---|
| 6,922,427 B2 | 7/2005 | Faist et al. |
| 8,068,528 B2 * | 11/2011 | Edamura et al. ............ 372/45.01 |
| 2011/0007768 A1 * | 1/2011 | Yamanishi et al. ......... 372/45.01 |

FOREIGN PATENT DOCUMENTS

| | | |
|---|---|---|
| JP | 2003-9000 | 1/2003 |
| JP | 2003-158679 | 5/2003 |
| JP | 2004-119814 | 4/2004 |
| JP | 2006-032691 | 2/2006 |
| JP | 3862850 | 10/2006 |
| JP | 2007-124675 | 5/2007 |
| JP | 2008-010733 | 1/2008 |
| JP | 2008-60396 | 3/2008 |
| JP | 2008-177366 | 7/2008 |
| JP | 2008-177709 | 7/2008 |
| JP | 2008-236176 | 10/2008 |

OTHER PUBLICATIONS

Mattias Beck et al., "Continuous Wave Operation of a Mid-Infrared Semiconductor Laser at Room Temperature," Science, Jan. 11, 2002, pp. 301-305, vol. 295.

J.S. Yu et al., "High-power continuous-wave operation of 6 jtm quantum-cascade laser at room temperature," Applied Physics Letters, Sep. 29, 2003, pp. 2503-2505, vol. 83, No. 13.

A. Evans et al., "Continuous-wave operation of $\lambda{\sim}4.8$ μm quantum-cascade laser at room temperature," Applied Physics Letters, Sep. 20, 2004, pp. 2166-2168, vol. 85, No. 12.

Alessandro Tredicucci et al., "A multiwavelength semiconductor laser," Nature, Nov. 26, 1998, pp. 350-353, vol. 396.

A. Wittmann et al., "Heterogeneous High-Performance Quantum-Cascade Laser Sources for Broad-Band Tuning," IEEE Journal of Quantum Electronics, Nov. 2008, pp. 1083-1088, vol. 44, No. 11.

Andreas Wittman et al., "High-Performance bound-to-Continuum Quantum-Cascade Lasers for Broad-Gain Applications," IEEE Journal of Quantum Electronics, Jan. 2008, pp. 36-40, vol. 44, No. 1.

Richard Maulini et al, "Broadband tuning of external cavity bound-to-continuum quantum-cascade lasers," Applied Physics Letters, 2004, pp. 1659-1661, vol. 84, No. 10.

A. Wittmann, et al., Intersubband linewidths in quantum cascade laser designs, Applied Physics Letters, 2008, pp. 141103-1-141103-3, vol. 93.

\* cited by examiner

*Fig.5*

| SEMICONDUCTOR LAYER | | COMPOSITION | LAYER THICKNESS | DOPING |
|---|---|---|---|---|
| INJECTION BARRIER LAYER 171 | | InAlAs | 3.7nm | undoped |
| EMISSION LAYER 17 | WELL LAYER 161 | InGaAs | 3.1nm | undoped |
| | BARRIER LAYER 172 | InAlAs | 2.7nm | undoped |
| | 162 | InGaAs | 7.5nm | undoped |
| | 173 | InAlAs | 0.9nm | undoped |
| | 163 | InGaAs | 5.8nm | undoped |
| | 174 | InAlAs | 1.0nm | undoped |
| | 164 | InGaAs | 5.2nm | undoped |
| EXIT BARRIER LAYER 191 | | InAlAs | 1.2nm | undoped |
| INJECTION LAYER 18 | WELL LAYER 181 | InGaAs | 4.1nm | undoped |
| | BARRIER LAYER 192 | InAlAs | 1.5nm | undoped |
| | 182 | InGaAs | 3.8nm | undoped |
| | 193 | InAlAs | 1.6nm | undoped |
| | 183 | InGaAs | 3.5nm | undoped |
| | 194 | InAlAs | 1.7nm | Si doped: $2 \times 10^{17}/cm^3$ |
| | 184 | InGaAs | 3.4nm | Si doped: $2 \times 10^{17}/cm^3$ |
| | 195 | InAlAs | 2.0nm | Si doped: $2 \times 10^{17}/cm^3$ |
| | 185 | InGaAs | 3.4nm | Si doped: $2 \times 10^{17}/cm^3$ |
| | 196 | InAlAs | 2.3nm | undoped |
| | 186 | InGaAs | 3.4nm | undoped |
| | 197 | InAlAs | 2.8nm | undoped |
| | 187 | InGaAs | 3.3nm | undoped |

…

QUANTUM CASCADE LASER

CROSS-REFERENCE TO RELATED APPLICATION

This application claims priority to Provisional Application Ser. No. 61/346,159 filed on May 19, 2010, which is hereby incorporated by reference in its entirety.

BACKGROUND OF THE INVENTION

1. Field of the Invention

The present invention relates to a quantum cascade laser using intersubband transitions in a quantum well structure.

2. Related Background Art

Light with a mid-infrared wavelength range (for example, wavelength of 5 to 30 µm) is an important wavelength range in the field of spectroscopy analysis. As a high-performance semiconductor light source in this wavelength range, in recent years, quantum cascade lasers (QCL) have received a lot of attention (for example, refer to Patent Documents 1 to 8 and Non-Patent Documents 1 to 8).

A quantum cascade laser is a monopolar type laser element which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers.

Patent Document 1: U.S. Pat. No. 5,457,709
Patent Document 2: U.S. Pat. No. 5,745,516
Patent Document 3: U.S. Pat. No. 6,751,244
Patent Document 4: U.S. Pat. No. 6,922,427
Patent Document 5: Japanese Patent Application Laid-Open No. H8-279647
Patent Document 6: Japanese Patent Application Laid-Open No. 2008-177366
Patent Document 7: Japanese Patent Application Laid-Open No. 2008-60396
Patent Document 8: Japanese Patent Application Laid-Open No. H10-4242
Non-Patent Document 1: M. Beck et al., "Continuous Wave Operation of a Mid-Infrared Semiconductor Laser at Room Temperature," Science Vol. 295 (2002) pp. 301-305
Non-Patent Document 2: J. S. Yu et al., "High-Power Continuous-Wave Operation of a 6 µm Quantum-Cascade Laser at Room Temperature," Appl. Phys. Lett. Vol. 83 (2003) pp. 2503-2505
Non-Patent Document 3: A. Evans et al., "Continuous-Wave Operation of λ~4.8 µm Quantum-Cascade Lasers at Room Temperature," Appl. Phys. Lett. Vol. 85 (2004) pp. 2166-2168
Non-Patent Document 4: A. Tredicucci et al., "A Multiwavelength Semiconductor Laser," Nature Vol. 396 (1998) pp. 350-353
Non-Patent Document 5: A. Wittmann et al., "Heterogeneous High-Performance Quantum-Cascade Laser Sources for Broad-Band Tuning," IEEE J. Quantum Electron. Vol. 44 (2008) pp. 1083-1088
Non-Patent Document 6: A. Wittmann et al., "High-Performance Bound-To-Continuum Quantum-Cascade Lasers for Broad-Gain Applications," IEEE J. Quantum Electron. Vol. 44 (2008) pp. 36-40
Non-Patent Document 7: R. Maulini et al., "Broadband Tuning of External Cavity Bound-to-Continuum Quantum-Cascade Lasers," Appl. Phys. Lett. Vol. 84 (2004) pp. 1659-1661
Non-Patent Document 8: A. Wittmann et al., "Intersubband Linewidths in Quantum Cascade Laser Designs," Appl. Phys. Lett. Vol. 93 (2008) pp. 141103-1-141103-3

SUMMARY OF THE INVENTION

In the above-described quantum cascade laser, when laser oscillation was successfully realized for the first time, the element operating temperature is limited to ultralow temperatures, however, in 2002, M. Beck et al., achieved a room-temperature CW operation at an oscillation wavelength of 9.1 µm (Non-Patent Document 1: M. Beck et al., Science Vol. 295 (2002) pp. 301-305). Thereafter, the group of M. Razeghi et al., also achieved a room-temperature CW operation at oscillation wavelengths of 6 µm and 4.8 µm (Non-Patent Document 2: J. S. Yu et al., Appl. Phys. Lett. Vol. 83 (2003) pp. 2503-2505, Non-Patent Document 3: A. Evans et al., Appl. Phys. Lett. Vol. 85 (2004) pp. 2166-2168). At present, room-temperature continuous oscillation in a broad wavelength range of 3.8 to 11.5 µm has been achieved and has already reached the stage of practical use.

After room-temperature continuous oscillation of the quantum cascade laser was achieved, it has been attempted to manufacture a quantum cascade laser which realizes single-mode oscillation in a broad wavelength range by using a laser element in combination with an external cavity (EC). Further, a distributed feed back (DFB) type quantum cascade laser for a room-temperature CW operation capable of scanning a single wavelength has also been developed.

Here, to achieve single-mode oscillation in a broad wavelength range, an emission layer structure capable of emitting light in a broad wavelength range must be adopted. At present, in an emission layer structure of a quantum cascade laser which realizes a room-temperature CW operation (RT-CW), a structure in which the peak gain is regarded as important and the full width at half maximum (FWHM) of emission of electroluminescence (EL) is narrow is mainly used. When normal intersubband transition between single levels is used, although it depends on various conditions such as the wavelength, the emission half width is generally approximately 15 to 25 meV (for example, approximately 20 meV at a wavelength around 8 µm), and is approximately 120 to 200 cm$^{-1}$ in terms of wave number.

On the other hand, as an active layer structure of a quantum cascade laser with a broad emission half width of EL, an active layer structure using a superlattice structure (chirped superlattice) is proposed (Non-Patent Document 4: A. Tredicucci et al., Nature Vol. 396 (1998) pp. 350-353). In this structure, an emission upper level and an emission lower level relating to emission are formed as minibands each consisting of many levels (subbands), and emission by miniband-miniband electron transition is used. According to this superlattice structure, emission transitions occur from a plurality of levels in an emission upper miniband to a plurality of levels in an emission lower miniband, so that a broad emission half width is necessarily obtained.

However, in this structure, a miniband is used for the emission upper level, so that selective carrier injection into a specific level is difficult, and as a result, excellent performance as a laser device cannot be obtained. The broad emission half width obtained in this superlattice structure is caused by transitions from a plurality of levels to a plurality of levels as described above, so that control of the emission transitions is difficult.

Specifically, the plurality of levels in the miniband are separated from each other by approximately 20 meV in terms of energies of the levels. Therefore, emission as a whole between the miniband and the miniband is superposition of some isolated emissions, and the intensities of the emissions are determined according to the transition intensities between levels depending on the operating electric field. Therefore, the emission spectrum obtained from the active layer structure with this superlattice may become an inhomogeneous spectrum in which respective transitions between levels can be clearly separated as shown in Non-Patent Document 4 described above.

Thus, in an emission mode with a spectrum inhomogeneously spread, even if the emission half width is broad, in the case of installation in the above-described EC type or DFB type quantum cascade laser, the possibility of oscillation at a wavelength other than a selected wavelength cannot be eliminated. Therefore, the active layer structure using the superlattice is not suitable for an EC type or DFB type broadband single axial mode light source.

On the other hand, as an emission layer structure realizing both of high performance and a broad emission band, there is a BTC (Bound to Continuum) active layer structure with a subband-miniband transition mode (Patent Document 4: U.S. Pat. No. 6,922,427). With the BTC structure, a broad emission half width which is 1.5 times as wide as that of other structures capable of performing a room-temperature CW operation is realized. Emission transition in this BTC structure is not miniband-miniband transition as in the superlattice structure, but is transition from a common single upper level, so that the gain is fixed to one emission transition concurrently with oscillation, and oscillation with a plurality of wavelengths does not occur.

At present, by combining BTC structures for two wavelengths, wavelength scanning in a pulse operation of an external cavity type quantum cascade laser (EC-QCL) is realized in a broad wavelength range of 292 cm$^{-1}$ (7.66 μm to 9.87 μm). In the CW operation, wavelength scanning with EC-QCL is also realized in a broadband of 201 cm$^{-1}$ (8.0 μm to 9.6 μm) (Non-Patent Document 5: A. Wittmann et al., IEEE J. Quantum Electron. Vol. 44 (2008) pp. 1083-1088).

However, in this BTC structure, satisfactory performance for light emission in a broad wavelength range has not been obtained. As described above, in a configuration in which a plurality of BTC active layer structures are coupled (multistacked) in series, the device design becomes complicated and may have an adverse effect on the device characteristics, such as a local high voltage, etc.

The present invention has been made in order to solve the above-described problems, and an object is to provide a quantum cascade laser capable of preferably obtaining emission in a broad wavelength range.

In order to achieve the above-described object, a quantum cascade laser according to the present invention includes (1) a semiconductor substrate, and (2) an active layer provided on the semiconductor substrate and having a cascade structure formed by alternately laminating quantum well emission layers and injection layers by multistage-laminating unit laminate structures each including the quantum well emission layer and the injection layer, wherein (3) the unit laminate structure included in the active layer has, in its subband level structure, a first emission upper level, a second emission upper level of an energy higher than the first emission upper level, and a plurality of emission lower levels of energies lower than the first emission upper level, (4) light is generated by intersubband transitions of electrons from the first emission upper level and the second emission upper level to the plurality of emission lower levels in the quantum well emission layer, and electrons after the intersubband transitions are injected into the quantum well emission layer of the unit laminate structure of the subsequent stage via the level in the injection layer, (5) the quantum well emission layer includes n well layers (n is an integer of 2 or more), and one of the first emission upper level and the second emission upper level is a level arising from a ground level in a first well layer closest to the injection layer side of the preceding stage, and the other is a level arising from an excitation level in a well layer except for the first well layer, and (6) an energy interval $\Delta E_{43}$ between the first emission upper level and the second emission upper level is set to be smaller than the energy of a longitudinal optical phonon, and for a higher energy level on the higher energy side adjacent to the second emission upper level, an energy interval $\Delta E_{54}$ between the second emission upper level and the higher energy level is set to be larger than the energy of a longitudinal optical phonon.

In the above-described quantum cascade laser, in the subband level structure in the unit laminate structure consisting of the emission layer and the injection layer, two emission upper levels of the first and second emission upper levels and a plurality (two or more) of emission lower levels are provided as levels relating to emission. Thus, by combining two emission upper levels and two or more emission lower levels, emission in a broad wavelength range can be preferably realized.

In addition, in the above-described configuration, specifically, one of the first and second emission upper levels consists of a level arising from a ground level in the first well layer of the emission layer, and the other consists of a level arising from an excitation level in the well layers (second to n-th well layers) except for the first well layer. Further, the energy interval $\Delta E_{43}$ between the first and second emission upper levels is set to be smaller than the energy $E_{LO}$ of a longitudinal optical (LO) phonon ($\Delta E_{43} < \Delta E_{LO}$), and as to the higher energy level adjacent to the second emission upper level on the higher energy side, the energy interval $\Delta E_{54}$ between the second emission upper level and the higher energy level is set to be larger than the energy $E_{LO}$ of the LO phonon ($E_{LO} < \Delta E_{54}$).

With this configuration, unlike an active layer structure using a superlattice structure that uses a miniband consisting of excitation levels in the well layers as emission upper levels, by the design of the coupling strengths between the levels and the energy intervals between the levels, etc., characteristics such as the emission spectrum to be obtained by the emission transitions can be preferably set and controlled. Accordingly, a quantum cascade laser capable of preferably obtaining emission in a broad wavelength range is realized. The subband level structure in the unit laminate structure as described above can be controlled by the design of the quantum well structure in the unit laminate structure constituting the active layer.

According to the quantum cascade laser of the present invention, in the subband level structure in the unit laminate structure constituting the active layer, as levels relating to emission, two emission upper levels of the first and second emission upper levels and a plurality of emission lower levels are provided, one of the first and second emission upper levels is set as a level arising from a ground level in the first well layer of the emission layer, and the other is set as a level arising from an excitation level in a well layer other than the first well layer, and the energy interval $\Delta E_{43}$ between the first emission upper level and the second emission upper level is set to be smaller than the energy of an LO phonon, and the energy interval $\Delta E_{54}$ between the second emission upper level and a higher energy level is set to be larger than the energy of an LO phonon, and accordingly, emission in a broad wavelength range can be preferably obtained.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 5 is a chart showing an example of a configuration of the unit laminate structure of one period in the active layer.

DESCRIPTION OF THE EMBODIMENTS

Figure 1:
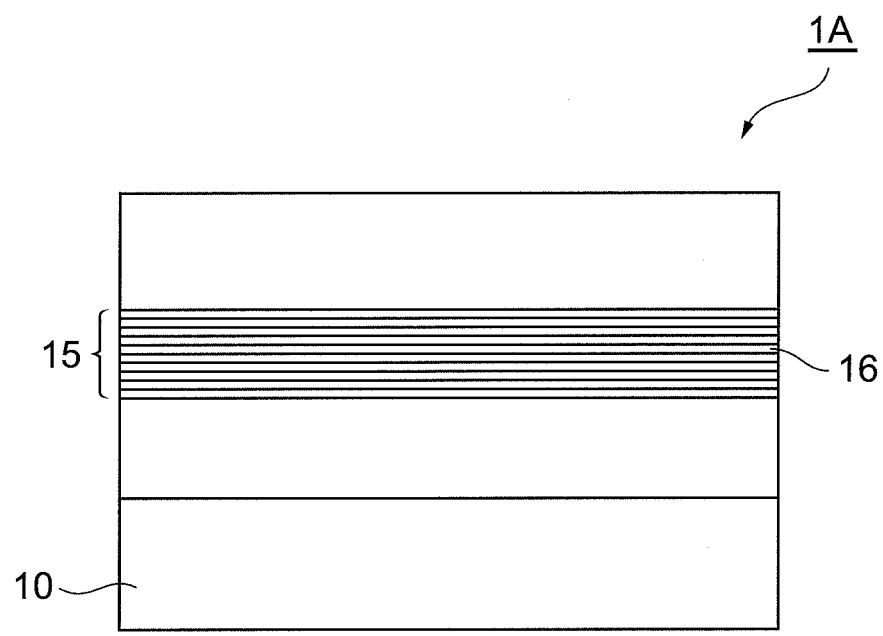
FIG. 1 is a view schematically showing a basic configuration of a quantum cascade laser.

Hereinafter, preferred embodiments of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a view schematically showing a basic configuration of a quantum cascade laser of the present invention. A quantum cascade laser 1A of the present embodiment is a monopolar type laser element which generates light by using intersubband electron transition in a semiconductor quantum well structure. This quantum cascade laser 1A includes a semiconductor substrate 10 and an active layer 15 formed on the semiconductor substrate 10.

The active layer 15 has a cascade structure formed by alternately multistage-laminating quantum well emission layers to be used for generating light and electron injection layers to be used for injecting electrons into the emission layers. In detail, a semiconductor lamination structure consisting of a quantum well emission layer and an injection layer is defined as a unit laminate structure 16 of one period, and by multistage-laminating the unit laminate structures 16, an active layer 15 with a cascade structure is configured. The number of laminations of the unit laminate structures 16 each including the quantum well emission layer and the injection layer is appropriately designed, and for example, approximately several hundred. The active layer 15 is formed on the semiconductor substrate 10 directly or via another semiconductor layer.

Figure 2:
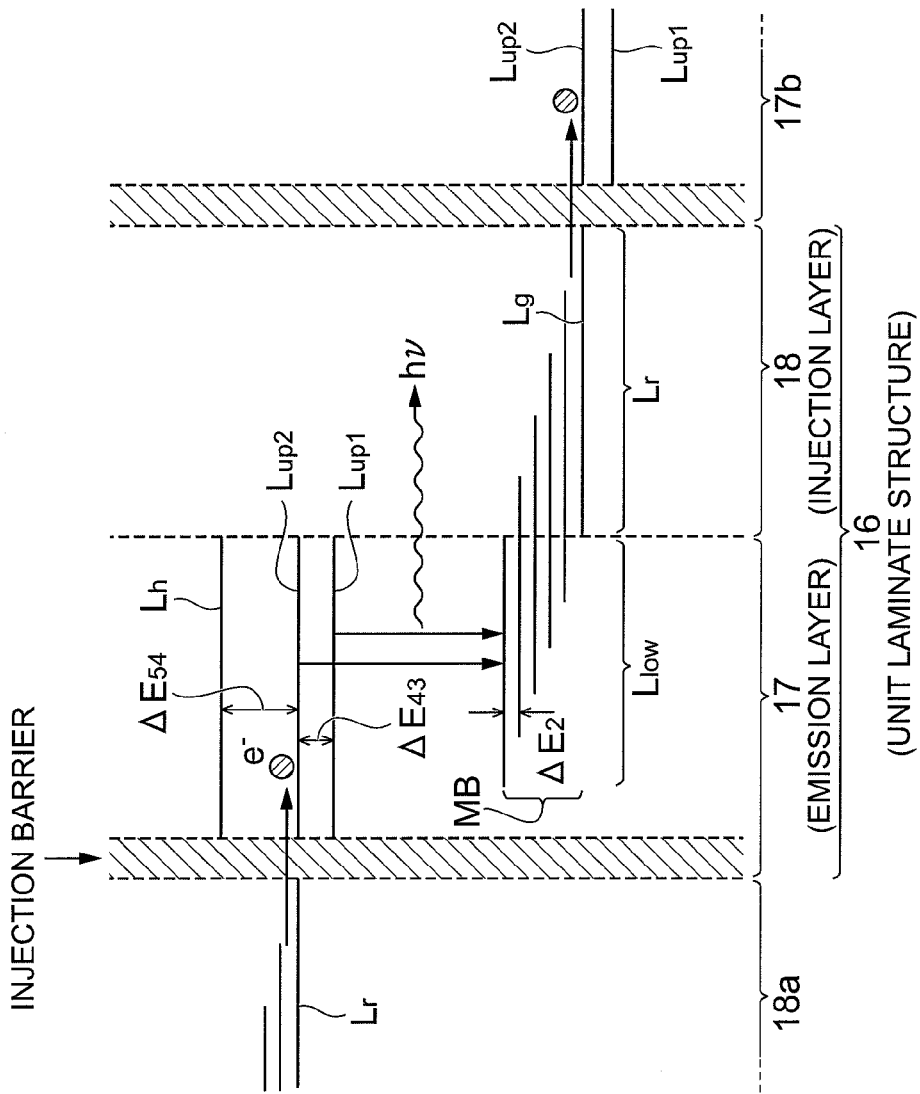
FIG. 2 is a diagram showing a subband level structure in an active layer of the quantum cascade laser.

FIG. 2 is a diagram showing a subband level structure in the active layer of the quantum cascade laser shown in FIG. 1. As shown in FIG. 2, each of the plurality of unit laminate structures 16 included in the active layer 15 consists of a quantum well emission layer 17 and an electron injection layer 18. These emission layer 17 and injection layer 18 are respectively formed to have a predetermined quantum well structure including quantum well layers and quantum barrier layers as described later. Accordingly, in the unit laminate structure 16, a subband level structure which is an energy level structure using the quantum well structure is formed.

The unit laminate structure 16 constituting the active layer 15 in the quantum cascade laser 1A according to the present embodiment has, as shown in FIG. 2, in its subband level structure, as levels relating to emission by intersubband transitions, a first emission upper level (level 3) $L_{up1}$, a second emission upper level (level 4) $L_{up2}$ of an energy higher than that of the first emission upper level, and a plurality of emission lower levels (level 2) $L_{low}$ of energies respectively lower than the first emission upper level.

In addition, in the present embodiment, the emission layer 17 includes n well layers (n is an integer of 2 or more), and one of the first and second emission upper levels $L_{up1}$, $L_{up2}$ is a level arising from a ground level in the first well layer closest to the injection layer 18a side of the preceding stage, and the other is a level arising from an excitation level in the well layers (second to n-th well layers) except for the first well layer.

As to energy intervals between subband levels, the energy interval $\Delta E_{43}$ between the first emission upper level $L_{up1}$ and the second emission upper level $L_{up2}$ is set to be smaller than the energy $E_{LO}$ of a longitudinal optical (LO) phonon ($\Delta E_{43} < E_{LO}$). Further, for a higher energy level (level 5) $L_h$ on the higher energy side adjacent to the second emission upper level, the energy interval $\Delta E_{54}$ between the second emission upper level $L_{up2}$ and the higher energy level $L_h$ is set to be larger than the energy $E_{LO}$ of an LO phonon ($E_{LO} < \Delta E_{54}$).

Here, for example, on the assumption that InGaAs is used as a semiconductor material of the quantum well layers, the energy $E_{LO}$ of an LO phonon is $E_{LO}$=34 meV. Further, the energy $E_{LO}$ of an LO phonon is 36 meV when the quantum well layers are made of GaAs, and 32 meV when the quantum well layers are made of InAs, and these values are substantially equivalent to 34 meV described above.

In this level structure, the two emission upper levels $L_{up1}$, $L_{up2}$ are preferably designed so that the energy positions of the levels match each other and the wave functions are strongly coupled (anticrossing) under the condition of the operating electric field. In this case, these two upper levels behave like one emission upper level with an energy width. In this structure, by changing the magnitude of coupling of two upper levels, the emission half width (FWHM) can be controlled. The plurality of emission lower levels $L_{low}$ constitute a lower miniband MB including a plurality of levels, and emission transitions from the first and second emission upper levels disperse into the lower miniband.

Further, in the unit laminate structure 16 shown in FIG. 2, between the emission layer 17 and the injection layer 18a in the unit laminate structure of the preceding state, an injection barrier layer for electrons to be injected from the injection layer 18a into the emission layer 17 is provided. Further, between the emission layer 17 and the injection layer 18, an exit barrier layer for electrons from the emission layer 17 to the injection layer 18 is provided as appropriate. However, FIG. 2 illustrates, as an example, a configuration in which only a barrier layer thin enough for satisfactorily leaking out the wave functions is provided between the emission layer 17 and the injection layer 18.

Further, in this level structure, the miniband MB has a band structure in which a miniband in the quantum well emission layer 17 and a miniband in the injection layer 18 are coupled and a plurality of levels are distributed to spread from the emission layer 17 to the injection layer 18. With this configuration, a portion of the miniband MB which is on the higher energy side of the miniband and is present in the emission layer 17 functions as a lower miniband consisting of the plurality of emission lower levels $L_{low}$ described above, and a portion which is on the lower energy side and present in the injection layer 18 functions as a relaxation miniband including relaxation levels (level 1) $L_r$ for relaxing electrons after emission transitions from the emission lower levels $L_{low}$ to the emission layer 17b of the subsequent stage.

Thus, by using successive levels as the emission lower levels $L_{low}$ and the relaxation levels $L_r$, a population inversion can be formed with extremely high efficiency. Among the plurality of relaxation levels $L_r$ constituting the relaxation miniband, the ground level $L_g$ in the injection layer 18 is preferably designed so as to be strongly coupled to the second emission upper level $L_{up2}$ in the emission layer 17b in the unit laminate structure of the subsequent stage under the condition of the operating electric field.

In this subband level structure, electrons e⁻ from the relaxation level $L_r$ in the injection layer 18a of the preceding stage are injected into the emission layer 17 via the injection barrier due to the resonant tunneling effect, and accordingly, the second emission upper level $L_{up2}$ coupled to the relaxation level $L_r$ is strongly excited. Further, at this time, sufficient electrons are also supplied to the first emission upper level $L_{up1}$ through a high-speed scattering process such as electron-electron scattering, so that both of the two emission upper levels $L_{up1}$, $L_{up2}$ are supplied with sufficient carriers.

Electrons injected into the first emission upper level $L_{up1}$ and the second emission upper level $L_{up2}$ transit respectively to the plurality of emission lower levels $L_{low}$ constituting the lower miniband, and at this time, light hv with a wavelength corresponding to the energy difference between the subband levels of the upper level $L_{up1}$, $L_{up2}$ and the lower level $L_{low}$ is generated and emitted. Further, at this time, as described above, the two upper levels behave like one emission upper level with an energy width, so that an obtained emission spectrum becomes a spectrum homogeneously spread. In FIG. 2, for illustrative convenience, only the emission transitions from the upper levels $L_{up1}$, $L_{up2}$ to the lower level $L_{low}$ on the highest energy side are shown, and transitions to other lower levels are not shown.

Electrons that transited to the emission lower levels $L_{low}$ are relaxed at a high speed by relaxation in the miniband through LO phonon scattering and electron-electron scattering, etc., in the miniband MB including the emission lower levels $L_{low}$ and the relaxation levels $L_r$ in the injection layer 18. Thus, when extracting carriers from the emission lower levels $L_{low}$ by using relaxation in the miniband, a population inversion for realizing laser oscillation is easily formed between the two upper levels $L_{up1}$, $L_{up2}$ and the plurality of lower levels $L_{low}$. Further, electrons relaxed from the emission lower levels $L_{low}$ to the levels $L_r$ in the injection layer 18 are injected in a cascade manner into the emission upper levels $L_{up1}$, $L_{up2}$ in the emission layer 17b of the subsequent stage via the ground level $L_g$ in the injection layer 18 as a relaxation level on the lower energy side.

By repeating these electron injection, emission transition, and relaxation in the plurality of unit laminate structures 16 constituting the active layer 15, light is generated in a cascade manner in the active layer 15. That is, by alternately laminating many quantum well emission layers 17 and injection layers 18, electrons successively move through the laminate structures 16 in a cascade manner, and at the time of intersubband transition in each laminate structure 16, light hv is generated. Further, this light is resonated by the optical resonator of the laser 1A, and accordingly, a laser beam with a predetermined wavelength is generated.

Effects of the quantum cascade laser 1A of the present embodiment will be described.

In the quantum cascade laser 1A shown in FIG. 1 and FIG. 2, in the subband level structure in the unit laminate structure 16 consisting of the emission layer 17 and the injection layer 18, two emission upper levels of the first and second emission upper levels $L_{up1}$, $L_{up2}$ and the plurality (two or more) of emission lower levels $L_{low}$ are provided as levels relating to emission. Thus, by combining two emission upper levels and two or more (more preferably, three or more) emission lower levels, emission in a broad wavelength range can be preferably realized.

In the configuration described above, specifically, one of the first and second emission upper levels $L_{up1}$, $L_{up2}$ consists of a ground level (a level arising from the ground level) in the first well layer of the emission layer 17, and the other consists of an excitation level (a level arising from the excitation level) in the well layer (second to n-th well layers) other than the first well layer in the emission layer. Further, the energy difference $\Delta E_{43}$ between the first and second emission upper levels is set to be smaller than the energy of an LO phonon, and the energy difference $\Delta E_{54}$ between the second emission upper level and the higher energy level is set to be larger than the energy of an LO phonon.

With this configuration, unlike an active layer structure using a superlattice structure using a miniband consisting of excitation levels in the well layers as emission upper levels, by the design of the strengths of coupling and energy intervals between levels, characteristics such as the emission spectrum to be obtained by the emission transitions can be preferably set and controlled.

In particular, when the design is made so that the wave functions of the two emission upper levels $L_{up1}$, $L_{up2}$ are strongly coupled under the condition of the operating electric field, these two upper levels behave like one emission upper level with an energy width as described above. In this case, an obtained emission spectrum does not become an inhomogeneous spectrum as in the case of a superlattice structure, but becomes a homogeneously spread spectrum. This emission spectrum is suitable for, for example, a broadband single axial mode light source of an EC type or DFB type, etc. As commonly known in ordinary semiconductor lasers, due to high-speed electron-electron scattering between levels, hole burning of a gain spectrum does not occur at the time of laser oscillation, and therefore, single axial mode oscillation can be maintained.

In the subband level structure shown in FIG. 2, electrons after emission transitions between subbands in the quantum well emission layer 17 are extracted at a high speed from the emission lower levels $L_{low}$ via the relaxation levels $L_r$ in the injection layer 18. Accordingly, a population inversion can be efficiently formed in the emission layer 17. Accordingly, a quantum cascade laser 1A capable of preferably obtaining emission in a broad wavelength range is realized.

The subband level structure in the unit laminate structure 16 described above can be controlled by the design of the quantum well structure in the unit laminate structure 16 constituting the active layer 15. As to the plurality of emission lower levels $L_{low}$ and the relaxation levels $L_r$ in the injection layer 18, in the subband level structure shown in FIG. 2, a miniband MB that has a function as a lower miniband including the emission lower levels $L_{low}$ and a function as a relaxation miniband including the relaxation levels $L_r$, and spread from the emission layer 17 to the injection layer 18, is provided. With this configuration, both of an emission transition structure including two upper levels and a plurality of lower levels and a relaxation structure for electrons after emission transitions can be preferably realized. By using a band structure in which the miniband in the emission layer 17 and the miniband in the injection layer 18 are strongly coupled, high efficient electron transportation from the emission layer 17 to the injection layer 18 can be realized.

In the subband level structure in the quantum cascade laser 1A described above, the energy interval $\Delta E_{43}$ between the first emission upper level $L_{up1}$ and the second emission upper level $L_{up2}$ is preferably set further within a range satisfying the condition of not less than 10 meV and not more than 25 meV:

$$10 \text{ meV} \leq \Delta E_{43} = 25 \text{ meV}$$

Accordingly, laser device characteristics, such as an emission spectrum to be obtained by emission transitions from the first and second upper levels to the plurality of lower levels, etc., can be preferably set.

Here, describing specifically design of the energy interval between the first and second emission upper levels, these two upper levels are respectively broadened to certain widths according to scattering and affects by the temperature. The degree of this level broadening is generally approximately ±10 meV, although this is determined depending on the temperature and interfaces and impurities in crystal. This can be confirmed according to absorption or the emission half width. Therefore, by appropriately designing the energy interval $\Delta E_{43}$ by considering the broadened widths of the upper levels, these two upper levels can be apparently regarded as one emission upper level.

As to the carrier distribution in the two upper levels, carriers must be sufficiently homogeneously distributed in the two upper levels functioning apparently as one emission upper level as described above. Here, when $N_3$ is the number of carriers in the first emission upper level (level 3) on the lower energy side and $N_4$ is the number of carriers in the second emission upper level (level 4) on the higher energy side, the ratio of these numbers of carriers is given by the following equation:

$$N_4/N_3 = \exp(-\Delta E_{43}/kT)$$

For example, at a room temperature (kT=25 meV), when the energy interval $\Delta E_{43}$ between the first and second emission upper levels is set to be substantially equal to 20 meV, $N_4/N_3$ is substantially equal to 0.45 even in an equilibrium state, and in the second emission upper level $L_{up2}$, half as many carriers as in the first emission upper level $L_{up1}$ exist. Further, by making a configuration so that electrons from the injection layer 18a of the preceding stage are injected into the second emission upper level $L_{up2}$ side, the numbers of carriers $N_3$ and $N_4$ can be set to be substantially equivalent to each other.

As to the plurality of emission lower levels (lower miniband), all of the energy intervals $\Delta E_2$ between levels adjacent to each other in the plurality of emission lower levels $L_{low}$ (refer to FIG. 2) are preferably set to be smaller than the energy of an LO phonon ($\Delta E_2 < E_{LO}$). Even with this configuration, laser device characteristics such as an emission spectrum to be obtained by emission transitions from the first and second upper levels to the plurality of lower levels can be preferably set.

The energy intervals $\Delta E_2$ in the plurality of emission lower levels $L_{low}$ are preferably set further within a range satisfying the condition of not less than 10 meV and not more than 25 meV:

$$10 \text{ meV} \leq \Delta E_2 \leq 25 \text{ meV}$$

similar to the first and second emission upper levels. The number of emission lower levels $L_{low}$ is preferably three or more.

The energy interval $\Delta E_{54}$ between the second emission upper level $L_{up2}$ and the higher energy level $L_h$ is preferably set further within a range satisfying the condition of not less than 50 meV:

$$50 \text{ meV} \leq \Delta E_{54}$$

Accordingly, among electrons to be injected from the level $L_r$ in the injection layer 18a of the preceding stage to the first and second emission upper levels $L_{up1}$, $L_{up2}$, leaking out of electrons to the level of energy higher than the energies of the emission upper levels can be suppressed. Thus, this level structure including the higher energy level satisfactorily separated from the first and second emission upper levels is completely different from the upper miniband in the active layer using a superlattice structure.

It is preferable that electrons e⁻ from the level $L_r$ in the injection layer 18a of the preceding stage to the quantum well emission layer 17 are injected into the second emission upper level $L_{up2}$. Thus, by injecting electrons into the second emission upper level on the higher energy side of the first and second emission upper levels, as described above, carriers are homogeneously distributed in two upper levels, and accordingly, emission transitions from the first and second upper levels respectively to the plurality of lower levels can be preferably realized.

In both of the first emission upper level $L_{up1}$ and the second emission upper level $L_{up2}$, an electron existence probability, given by a square of a wave function, except in the first well layer of the quantum well emission layer 17 in the active layer is preferably not less than 30%. Thus, with the configuration in which the wave functions of the first and second emission upper levels are not localized in the first well layer in the emission layer but electrons are made to exist with a sufficient probability in the second to n-th well layers as well, and these wave functions spread over the inside of the emission layer 17, the first and second emission upper levels are made to preferably function as levels for emission transitions to the plurality of emission lower levels, and accordingly, homogeneous emission transitions can be realized.

Figure 3:
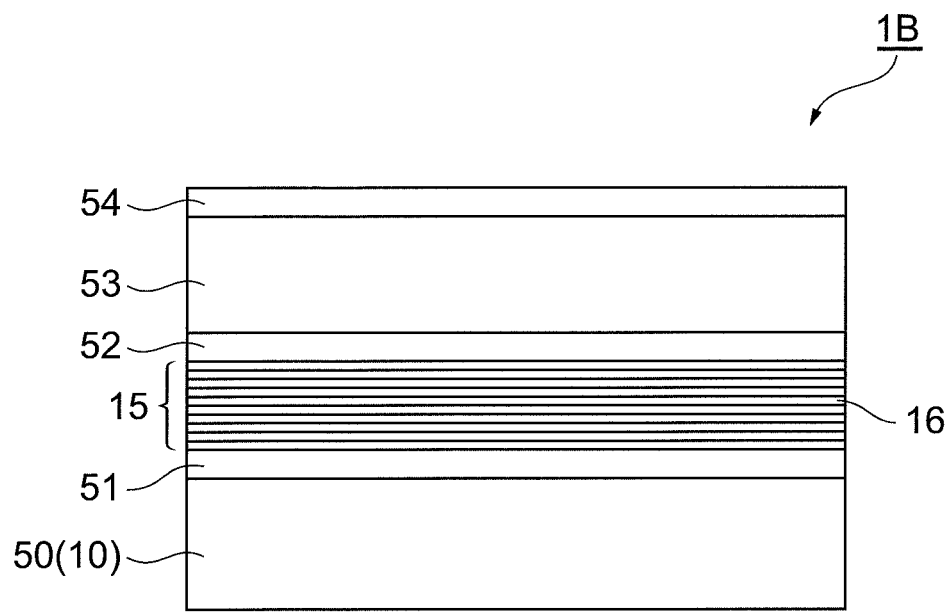
FIG. 3 is a view showing an example of a configuration of the quantum cascade laser.
Figure 4:
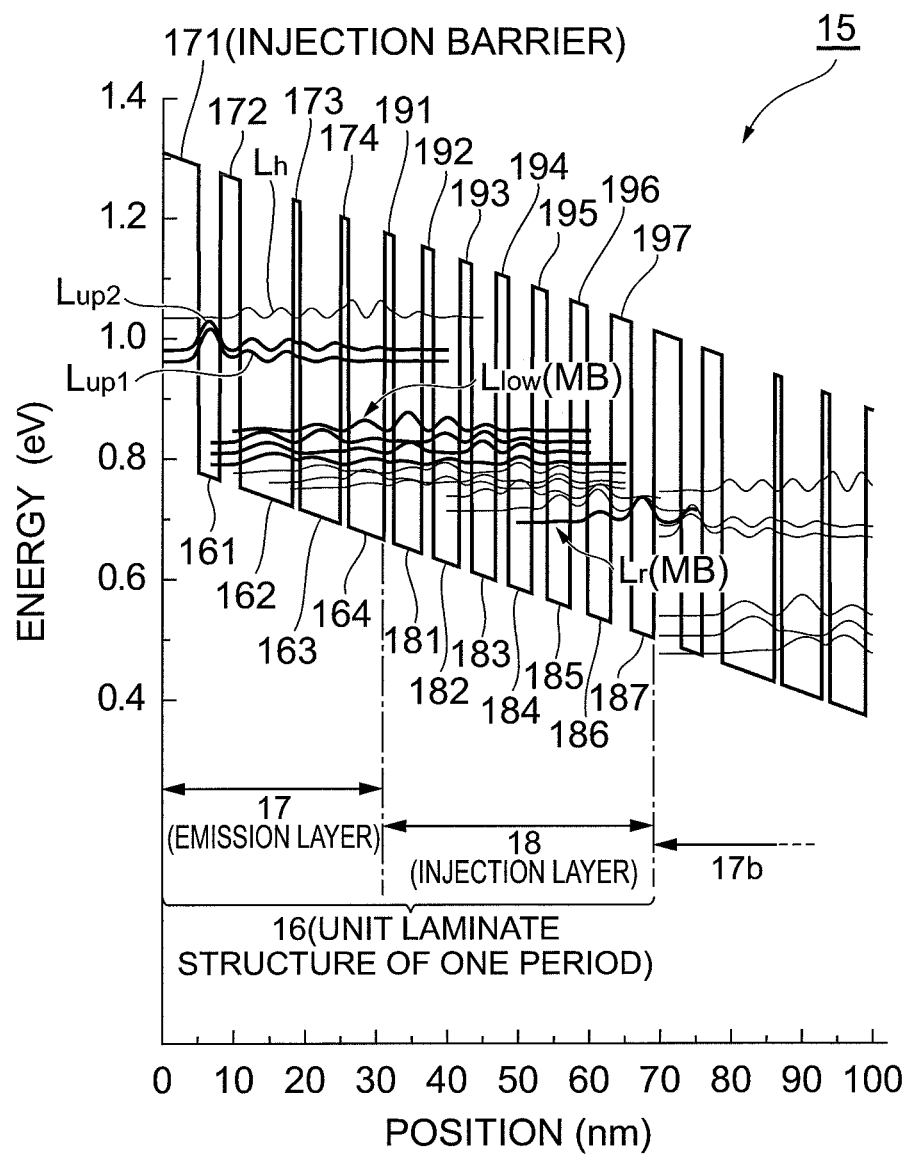
FIG. 4 is a diagram showing an example of a configuration of a unit laminate structure constituting the active layer.

The configuration of the quantum cascade laser of the present invention will be further described along with a specific example of a device structure including a quantum well structure in the active layer. FIG. 3 is a view showing an example of a specific configuration of the quantum cascade laser. FIG. 4 is a diagram showing an example of a configuration of a unit laminate structure constituting the active layer in the quantum cascade laser shown in FIG. 3.

The quantum well structure of the active layer 15 in this configuration example shows an example designed to be the oscillation wavelength to 8.7 μM (oscillation energy: 142 meV) and the operating electric field to 41 kV/cm. FIG. 4 shows a quantum well structure and a subband level structure of a part of the multistage repeated structure including the emission layers 17 and the injection layers 18 in the active layer 15. The device structure shown in FIG. 3 and FIG. 4 can be formed by, for example, crystal growth according to the molecular beam epitaxy (MBE) method or the metal organic vapor phase epitaxy (MOVPE) method.

In the semiconductor lamination structure of a quantum cascade laser 1B shown in FIG. 3, an n-type InP single crystal substrate 50 is used as a semiconductor substrate 10. Then, on this InP substrate 50, in order from the substrate side, an InGaAs lower core layer 51 with a thickness of 300 nm, an active layer 15 including multistage-laminated unit laminate structures 16, an InGaAs upper core layer 52 with a thickness of 300 nm, an InP cladding layer 53 with a thickness of 3.5 μM, and an InGaAs contact layer 54 with a thickness of 10 nm are laminated sequentially, and accordingly, a device structure of the quantum cascade laser 1B is formed.

In this configuration example, the active layer 15 is configured by laminating the unit laminate structures 16 each including the quantum well emission layer 17 and the electron injection layer 18 in 40 periods. The unit laminate structure 16 of one period is configured as shown in FIG. 4 as a quantum well structure formed by alternately laminating eleven quantum well layers 161 to 164, 181 to 187, and eleven quantum barrier layers 171 to 174, 191 to 197.

Among these semiconductor layers constituting the unit laminate structure 16, the quantum well layers are formed of $In_{0.53}Ga_{0.47}As$ layers. The quantum barrier layers are formed of $Al_{0.52}In_{0.48}As$ layers. Accordingly, the active layer 15 is configured by an InGaAs/InAlAs quantum well structure lattice-matched to the InP substrate 50.

In this unit laminate structure 16, as to the emission layer 17 and the injection layer 18, in the lamination structure shown in FIG. 4, the lamination portion consisting of the four well layers 161 to 164 and barrier layers 171 to 174 mainly functions as the emission layer 17. Further, the lamination portion consisting of the seven well layers 181 to 187 and barrier layers 191 to 197 mainly functions as the injection layer 18. Among the semiconductor layers of the emission layer 17, the quantum barrier layer 171 of the first stage is positioned between the injection layer of the preceding stage and the emission layer 17, and serves as an injection barrier layer for electrons from the injection layer of the preceding stage to the emission layer 17.

In this configuration example, as to an exit barrier layer for electrons from the emission layer 17 to the injection layer 18, positioned between the emission layer 17 and the injection layer 18, no barrier layer effectively functioning as an exit barrier is present. In FIG. 4, the wave functions of the emission upper levels $L_{up1}$, $L_{up2}$ described later attenuate before the fifth barrier layer 191 in the unit laminate structure 16, so that this barrier layer 191 is formally set as an exit barrier layer, and before and after this barrier layer, the emission layer 17 and the injection layer 18 are functionally divided. FIG. 5 shows an example of a detailed structure of the unit laminate structure 16 of one period in the active layer 15.

In this configuration, the unit laminate structure 16 has, in its subband level structure shown in FIG. 4, a first emission upper level (level 3) $L_{up1}$, a second emission upper level (level 4) $L_{up2}$, a plurality of emission lower levels (level 2) $L_{low}$, and relaxation levels (level 1) $L_r$. In detail, in the level structure shown in FIG. 4, twelve levels contribute to a laser operation, and the pluralities of levels respectively correspond to the emission lower levels $L_{low}$ and the relaxation levels $L_r$. The plurality of emission lower levels and the plurality of relaxation levels constitute a miniband MB in which a plurality of levels are distributed to spread from the emission layer 17 to the injection layer 18, as described above. The layer thicknesses of the well layers and barrier layers in the emission layer 17 and the injection layer 18 are respectively designed based on quantum mechanics.

Specific design steps for the quantum well structure in the unit laminate structure 16 shown in FIG. 4 will be described. First, for providing an oscillation wavelength in a laser device, the energy interval between the first emission upper level (level 3) $L_{up1}$ and the emission lower levels (level 2) $L_{low}$ and a structure for extracting electrons from the emission lower levels are determined. In the subband level structure described above, a lower miniband including a plurality of levels is used as the emission lower levels $L_{low}$.

The energy difference between the first emission upper level $L_{up1}$ and the lower miniband including the plurality of emission lower levels $L_{low}$ is determined according to the well widths of the well layers 161, 162, 163, and 164 and the thicknesses of the barrier layers 172, 173, and 174 in the emission layer 17, and the operating electric field. The operating electric field is set based on the estimated laminate structure film thickness and the amount of voltage drop per one period. In this configuration example, as described above, the operating electric field is set to be 41 kV/cm.

Here, the well widths of the well layers 161 to 164, the thicknesses of the barrier layers 172 to 174, and the thickness of the barrier layer 191 of the injection layer 18 which determine the emission wavelength cannot be determined independently because the wave functions of the levels are respectively sensitively influenced by the quantum well layers and barrier layers. Therefore, the layer thicknesses of these semiconductor layers are quantum-mechanically determined by using numerical calculations. When determining a level position of the second emission upper level $L_{up2}$ in the next design step, the designed wavelength changes again. Therefore, here, first, configurations of the quantum well layers 162, 163, and 164 and the barrier layers 173 and 174 are roughly determined.

Next, the well width of the quantum well layer 161 for designing the second emission upper level (level 4) $L_{up2}$ is determined. The layer thickness of this well layer 161 which is a first well layer in the emission layer 17 inevitably becomes thinner than other well layers in the emission layer 17 because the ground level when the first well layer 161 is present as a single quantum well layer corresponds to the second emission upper level $L_{up2}$.

The first and second emission upper levels $L_{up1}$, $L_{up2}$ must have wave functions coupled together and sufficiently overlap each other under the condition of the operating electric field. Therefore, the thickness of the first well layer 161 is set so that the ground level in the well layer 161 and the first emission upper level $L_{up1}$ become substantially equal in energy in the operating electric field. It is noted that, at this time, the first emission upper level $L_{up1}$ is an excitation level in the well layer other than the first well layer 161.

Further, the thickness of the second barrier layer 172 determines the magnitude of anticrossing when the first and second emission upper levels $L_{up1}$, $L_{up2}$ are coupled (the energy difference $\Delta E_{43}$ between the level 3 and the level 4 when they are completely coupled). The magnitude of anticrossing becomes greater as the barrier layer 172 becomes thinner, and becomes smaller as the barrier layer 172 becomes thicker.

The quantum cascade laser of the present invention realizes a broad emission half width by controlling transitions from the first and second emission upper levels $L_{up1}$, $L_{up2}$ to the emission lower levels $L_{low}$. Therefore, when the thickness of the barrier layer 172 is not appropriate, such a function is deteriorated. Specifically, when the barrier layer 172 is excessively thin, $\Delta E_{43}$ becomes larger, so that the transition to the emission lower level $L_{low}$ is biased to transition from either the first emission upper level $L_{up1}$ or the second emission upper level $L_{up2}$, and the emission half width becomes narrow. Even if emission is obtained without being biased, the emission spectrum thereof becomes inhomogeneous as in the case of interminiband transition.

On the other hand, when the barrier layer 172 is excessively thick, $\Delta E_{43}$ becomes excessively small, however, before this, if a barrier layer thicker than the injection barrier layer 171 is present in the cascade structure, carrier transportation becomes difficult, and the laser operation itself may be deteriorated. In this regard, the thickness of the barrier layer 172 must be appropriately set to be thinner than the injection barrier layer 171. In the configuration example shown in FIG. 4, by designing the thickness of the barrier layer 172 to 2.7 nm, the energy difference $\Delta E_{43}$ between the emission upper levels $L_{up1}$, $L_{up2}$ is calculated to be 18 meV.

Further, as the plurality of emission lower levels $L_{low}$, as described above, the miniband MB is used. In this miniband MB, a large number of levels are present in a state where wave functions spatially spread. In order to satisfy this configuration condition, all barrier layers constituting the emission layer 17 must be thin in layer thickness, and the levels must be strongly coupled to each other.

Moreover, levels originally present in the electron injection layer 18 are also used as levels constituting the miniband MB, so that it is important that the layer thickness of the first barrier layer (exit barrier layer) 191 of the injection layer 18 is also set to be thin so that wave functions of these levels leak out to the emission layer 17. This exit barrier layer 191 must be carefully designed because if it is excessively thick, not only is the flow of electrons from the inside of the emission layer 17 to the injection layer 18 blocked but also formation of the lower miniband MB is obstructed. In this configuration example, as described above, the first barrier layer 191 does not effectively function as an exit barrier.

In these design steps, the designed wavelength and differences between levels always change, however, by fine adjustments for each change, the thicknesses of all quantum well layers and barrier layers included in the emission layer 17 are determined. Finally, the layer thicknesses of the well layers 161, 162, 163, and 164 in the emission layer 17 were set to be 3.1 nm, 7.5 nm, 5.8 nm, and 5.2 nm, respectively. The layer thicknesses of the barrier layers 172, 173, and 174 and the barrier layer 191 of the injection layer 18 were set to be 2.7 nm, 0.9 nm, 1.0 nm, and 1.2 nm, respectively.

Subsequently, the electron injection layer 18 is designed. In this configuration example, as a structure of the injection layer 18, a funnel injector (refer to Patent Document 8: Japanese Patent Application Laid-Open No. H10-4242) was used. By thus using a funnel injector, by making the energy width of the miniband MB narrower as the position becomes closer to the next period, the electron injection efficiency into the second emission upper level $L_{up2}$ can be increased. This level structure can be realized in the injection layer 18 by making the layer thickness of the quantum well layer thinner and the layer thickness of the barrier layer thicker as the position becomes closer to the emission layer 17b of the next period from the emission layer 17 side.

In the structure shown in FIG. 4, for designing the injection layer 18, the quantum well layer 187 adjacent to the emission layer 17b of the next period must be designed first. This is because the wave function of the level in the well layer 187 (the ground level in the injection layer 18 in the operating electric field) must follow the emission upper level in any electric field not more than the operating electric field.

In order to realize this state, the layer thickness of the well layer 187 must be slightly thicker (approximately several Å) than the well layer 161. In this configuration example, while the well layer 161 of the emission layer 17 has a thickness of 3.1 nm, the thickness of the well layer 187 of the injection layer 18 is set to be 3.3 nm. Accordingly, by electron injection from the relaxation miniband, the second emission upper level $L_{up2}$ can be excited, and a broad emission half width can be realized.

Here, for example, considering a case where the well layer 187 is set to be approximately 6 Å (0.6 nm, 2 atomic layers) thicker than the well layer 161, under condition of a low electric field, the relaxation level in the well layer 187 not only becomes an energy lower than the second emission upper level $L_{up2}$ in the well layer 161, but is also positioned at an energy side even lower than the first emission upper level $L_{up1}$. In this level structure, when approaching the operating electric field, electrons are injected into the first emission upper level $L_{up1}$ first, and it becomes difficult to obtain a broad emission half width.

After determining the layer thickness of the well layer 187, according to the same method as conventionally, layer thicknesses of other quantum well layers and barrier layers in the injection layer 18 are determined. Designing of the layer thickness of the first barrier layer 191 of the injection layer 18 is as described above.

Among the semiconductor layers constituting the injection layer 18, the thicknesses of the well layers and the barrier layers on the exit barrier layer 191 side are designed so that all of the electrons from the levels in the emission layer 17 can be transported to the miniband formed in the injection layer 18. On the other hand, concerning the thicknesses of the well layers and the barrier layers on the injection barrier layer 171 side of the next period, the relaxation miniband must be sufficiently narrowed so that electrons from the injection layer 18 are injected only into the second emission upper level $L_{up2}$ of the next period and are not injected into the level $L_h$ on the higher energy side.

As a result of design by considering the above-described points, the layer thicknesses of the well layers 181 to 187 in the injection layer 18 were set to be 4.1 nm, 3.8 nm, 3.5 nm, 3.4 nm, 3.4 nm, 3.4 nm, and 3.3 nm, respectively. The layer thicknesses of the barrier layers 192 to 197 were set to be 1.5 nm, 1.6 nm, 1.7 nm, 2.0 nm, 2.3 nm, and 2.8 nm, respectively.

Finally, the layer thickness of the injection barrier layer 171 in the quantum well emission layer 17 is determined. This barrier layer 171 determines the strengths of couplings between the periods in the cascade structure of the multistage unit laminate structures 16, and determines an applicable maximum current. The strength of coupling of wave functions is determined by the anticrossing gap, and, in this configuration example, the anticrossing gap was set to be 7.3 meV, and the design was made so that a current equivalent to that in conventional techniques is applicable. In this case, the thickness of the injection barrier layer 171 is 3.7 nm.

The characteristics, etc., of the quantum cascade laser according to the configuration example designed as described above will be described with reference to FIG. 6 to FIG. 9.

Figure 6:
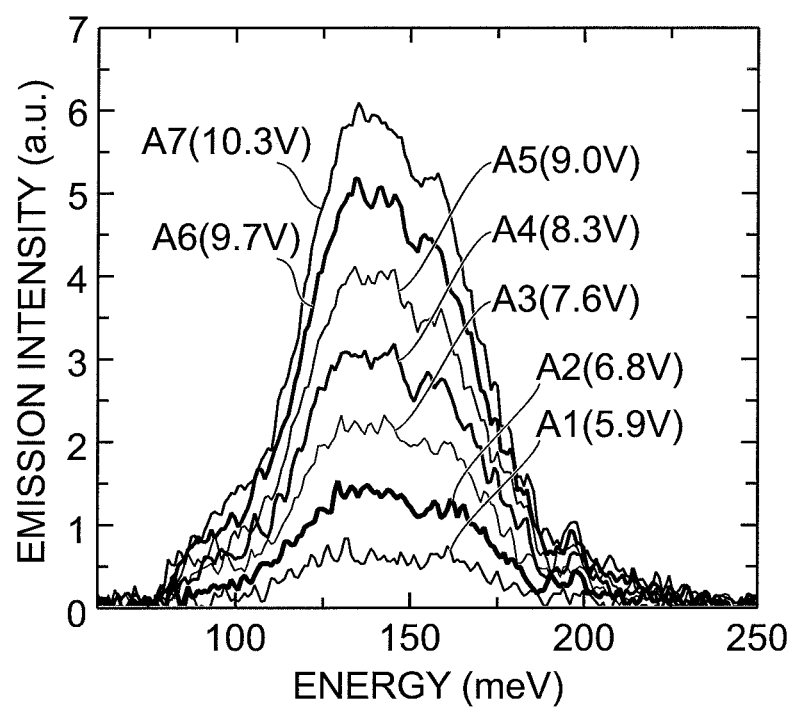
FIG. 6 is a graph showing emission spectra obtained by the quantum cascade laser.

FIG. 6 is a graph showing operating voltage dependence of the emission spectrum obtained with the quantum cascade laser. In this graph, the horizontal axis indicates the emission energy (meV), and the vertical axis indicates the emission intensity (a.u.). The graphs A1 to A7 show emission spectra when the applied voltage is 5.9V, 6.8V, 7.6V, 8.3V, 9.0V, 9.7V, and 10.3V, respectively. As shown by these graphs A1 to A7, by adopting the above-described level structure (dual-state-to-continuum) in the active layer, broad and flat emission is observed in the emission spectra. The emission half width in this case is equivalent to that in, for example, a 2-stack type BTC (bound-to-continuum) structure, and broad and high-quality emission is realized with a single design recipe.

Figure 7:
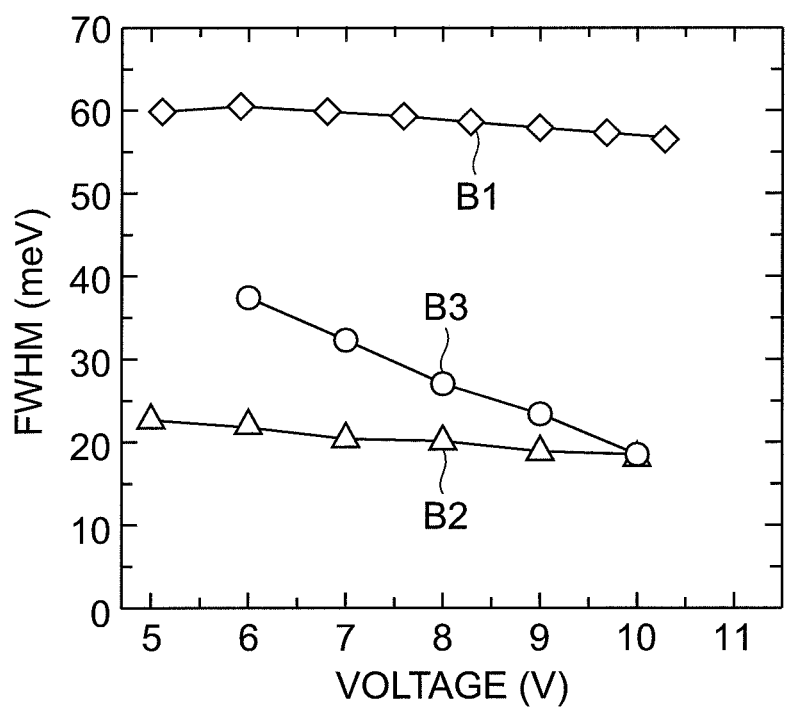
FIG. 7 is a graph showing voltage dependence of emission half width.

FIG. 7 is a graph showing voltage dependence of the emission half width (FWHM of emission spectrum). In this graph, the horizontal axis indicates an applied voltage (V), and the vertical axis indicates the FWHM (meV) corresponding to the emission half width. Here, operation examples when the operation temperature is set to be 300K (graph B1) or 303K (graphs B2 and B3) are shown. The graphs (data plots) B1, B2, and B3 show voltage dependence of the emission half width when the above-described novel structure, the conventional bound-to-bound structure, and the BTC structure are used, respectively (for example, refer to Non-Patent Document 8: A. Wittmann et al., Appl. Phys. Lett. Vol. 93 (2008) pp. 141103-1-141103-3).

As shown in these graphs B1 to B3, a very broad emission half width is obtained in the above-described novel structure as compared with other structures. In addition, observing the voltage dependence of the emission half width, in the BTC structure, the emission half width decreases according to an increase in voltage. On the other hand, in the novel structure, the emission half width is substantially constant, and the voltage dependence is very small. This shows that the above-described novel structure has remarkably great superiority in regard to application to a laser device of a DFB type or EC type.

In the quantum cascade laser of the above-described configuration, in the emission transitions from the first and second emission upper levels $L_{up1}$, $L_{up2}$ to the plurality of the emission lower levels $L_{low}$, as described above, only when sufficient transition intensities are respectively obtained from the two levels $L_{up1}$, $L_{up2}$, satisfactory characteristics and functions can be obtained. Therefore, the two upper levels must be sufficiently coupled in an operating state, and the wave functions thereof must be spread over the inside of the emission layer 17. One of the first and second emission upper levels is localized basically in the first well layer of the emission layer 17, and only when the level is coupled to the other upper level, wave functions spread over the inside of the emission layer 17.

Figure 8:
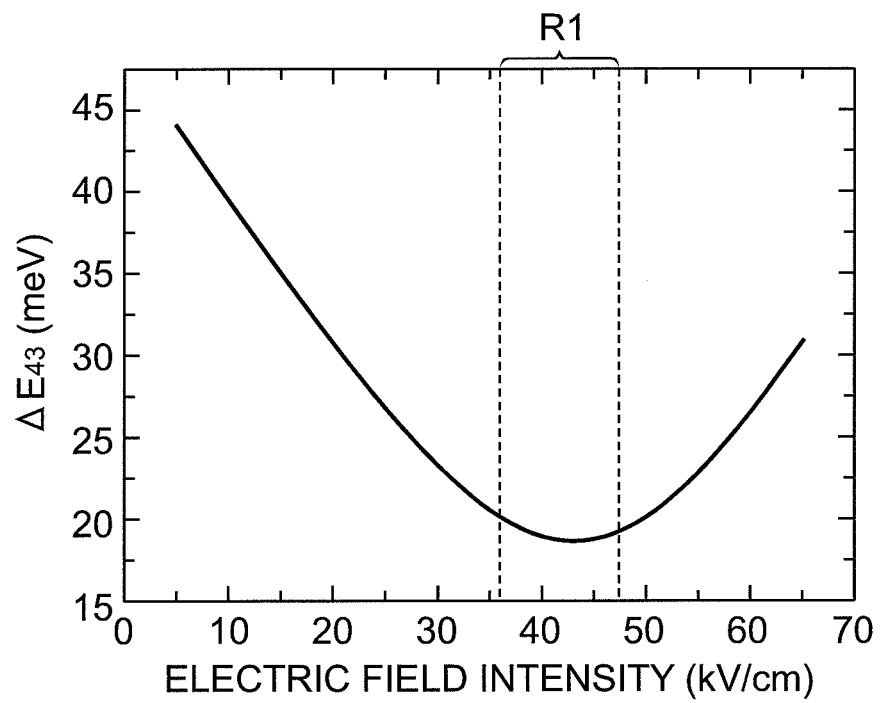
FIG. 8 is a graph showing electric field intensity dependence of an energy interval between the first and second emission upper levels.

Here, FIG. 8 is a graph showing field intensity dependence of the energy interval between the first emission upper level $L_{up1}$ and the second emission upper level $L_{up2}$. In this graph, the horizontal axis indicates the electric field intensity (kV/cm) applied to the active layer 15, and the vertical axis indicates the energy interval $\Delta E_{43}$ (meV) between the first and second emission upper levels.

Figure 9:
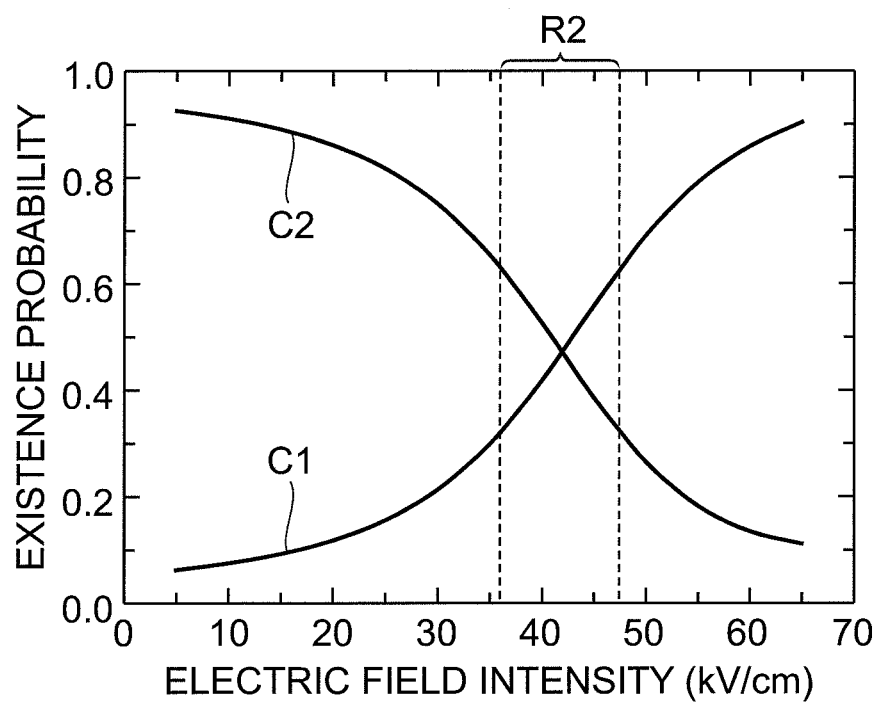
FIG. 9 is a graph showing electric field intensity dependence of electron existence probabilities of the first and second emission upper levels except for the first well layer in the emission layer.

Further, FIG. 9 shows a graph showing field intensity dependence of electron existence probabilities of the first emission upper level $L_{up1}$ and the second emission upper level $L_{up2}$ except for the first well layer 161 in the emission layer 17. In this graph, the horizontal axis indicates the electric field intensity (kV/cm) as in FIG. 8, and the vertical axis indicates electron existence probabilities of the emission upper levels except in the first well layer 161. The graph C1 shows an existence probability of the first emission upper level except in the first well layer 161, and the graph C2 shows an existence probability of the second emission upper level except in the first well layer 161.

As shown in these graphs, in the above-described configuration example, in the range in which the electric field intensity is 36 to 47 kV/cm shown by the ranges R1 and R2 respectively in FIG. 8 and FIG. 9, the first and second emission upper levels $L_{up1}$, $L_{up2}$ are strongly coupled, and for both of these emission upper levels, a preferred condition for an electron existence probability not less than 30% except in the first well layer 161 is satisfied. In this case, the energy interval between the two emission upper levels is smallest. In the quantum cascade laser with the above-described novel structure, the quantum well structure in the unit laminate structure 16 and a corresponding subband level structure are preferably designed by considering the coupled state, the energy interval, and spread of wave functions (existence probabilities) of the first and second emission upper levels.

Characteristics, etc., of the quantum cascade laser according to the above-described configuration example will be further described with reference to FIG. 10 to FIG. 12. Here, characteristics of a laser device configured by designing the resonator length to be 4 mm and a ridge width in a configuration of a ridge waveguide type to be 14 μm are shown. In the laser device, the laser end faces are formed by a cleavage, and are not coated with a special coating, etc.

Figure 10:
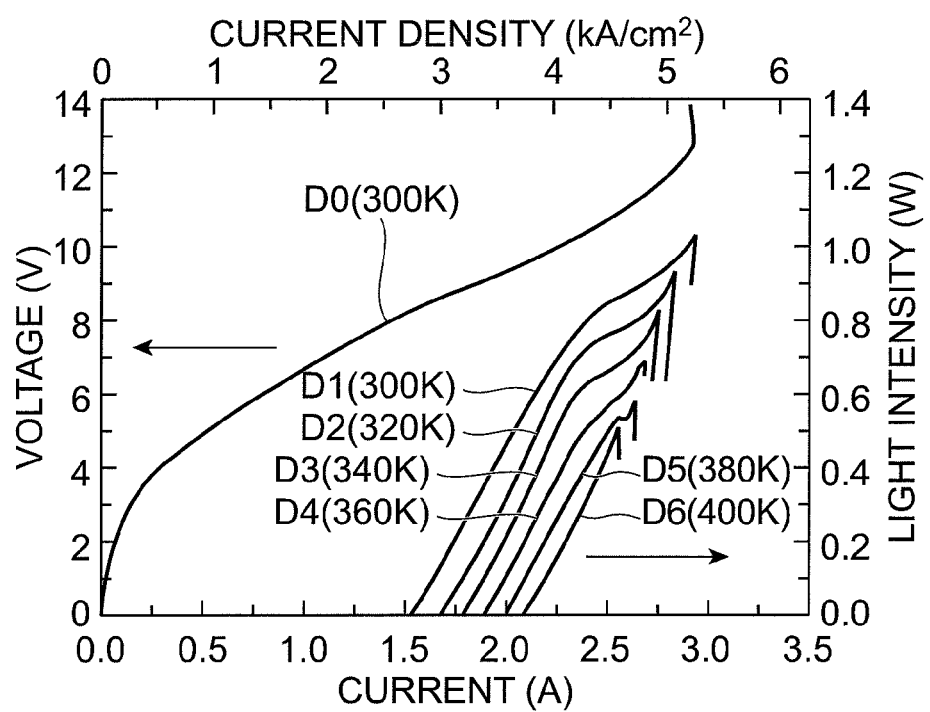
FIG. 10 is a graph showing current—voltage—light output characteristics of the quantum cascade laser.

FIG. 10 is a graph showing current—voltage—light output characteristics of the quantum cascade laser. In this graph, the horizontal axis indicates the current (A) or the current density (kA/cm$^2$) and the vertical axis indicates the voltage (V) or the light intensity (W). Here, specifically, laser device characteristics when the laser device is pulse-operated with a pulse width of 100 ns and a repetition frequency of 100 kHz are shown. Further, the graph D0 shows current—voltage characteristics at an operating temperature of 300K, and the graphs D1 to D6 show current—light output characteristics at the operating temperatures of 300K, 320K, 340K, 360K, 380K, and 400K.

As shown by these graphs D0 to D6, with the above-described novel structure, very excellent laser characteristics are obtained. Further, the threshold current density at a room temperature is as low as 2.6 kA/cm$^2$ which is comparable to that in a laser device with a narrow gain width. In addition, the total light output from both end faces of the laser device reaches 1 W at a room temperature, so that a laser device with an extremely high output can be realized. Further, as a slope efficiency, approximately 1 W/A is obtained.

Figure 11:
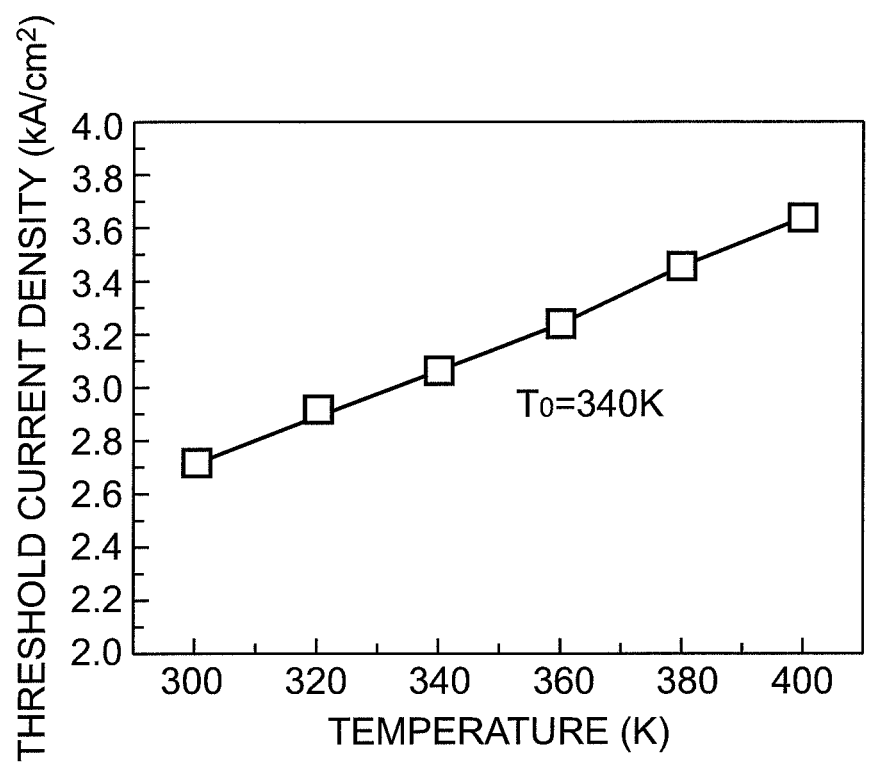
FIG. 11 is a graph showing temperature dependence of threshold current density.

FIG. 11 is a graph showing temperature dependence of the threshold current density. In this graph, the horizontal axis indicates the temperature (K), and the vertical axis indicates the threshold current density (kA/cm$^2$). As shown in this graph, the temperature characteristics of the threshold are very satisfactory. The value of the characteristic temperature $T_0$ showing a rate of a threshold increase due to the temperature is about 340K, and is approximately twice the values of the quantum cascade lasers reported in the past. The characteristic temperature $T_0$ is defined by the following equation:

$$J_{th} = J_0 \exp(T/T_0)$$

In FIG. 11, the highest operating temperature is not less than 400K, and it is estimated from the threshold and the characteristic temperature that the laser oscillates at up to approximately 470K.

Figure 12:
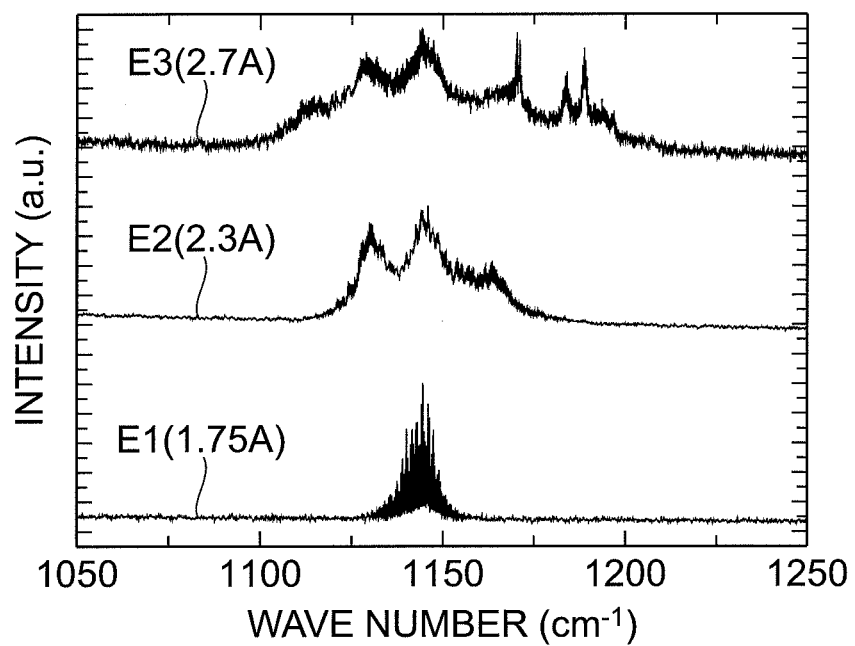
FIG. 12 is a graph showing oscillation spectra of the quantum cascade laser.

FIG. 12 is a graph showing oscillation spectra of the quantum cascade laser. In this graph, the horizontal axis indicates a wave number (cm$^{-1}$), and the vertical axis indicates the intensity (a.u.). Further, the graphs E1 to E3 show oscillation spectra at the currents of 1.75 A, 2.3 A, and 2.7 A, respectively.

As shown by these graphs E1 to E3, the quantum cascade laser with the novel structure oscillates near the peak of gain immediately after starting oscillation, however, a spectral spread that may be caused by coherent instability is observed as the current increases, and a state where the axial mode of oscillation occurs in a very broad wavelength range is observed. From this occurrence of the axial mode in a broad range, it can be confirmed that the gain of the novel structure described above is very broad.

The quantum cascade laser of the present invention is not limited to the above-described embodiments and configuration examples, and can be modified in many ways. For example, in the configuration example described above, an InP substrate is used as a semiconductor substrate, and the active layer is made of InGaAs/InAlAs, however, specifically, various configurations may be used as long as the emission transitions by intersubband transitions are possible in the quantum well structure and the above-described subband level structure can be realized.

As the semiconductor material system, in addition to the above-described InGaAs/InAlAs, various material systems such as, for example, GaAs/AlGaAs, InAs/AlSb, GaN/AlGaN, and SiGe/Si, etc., can be used. As the crystal growth method of the semiconductor, various methods can be used.

As the lamination structure in the active layer of the quantum cascade laser and the semiconductor lamination structure as the whole laser device, in addition to the structures shown in FIG. 3 to FIG. 5, various structures can be used. Generally, the quantum cascade laser is required to include a semiconductor substrate, and an active layer configured as described above and provided on the semiconductor substrate. Further, in the above-described configuration example, a configuration lattice-matched to the InP substrate is described, however, for example, a configuration introducing lattice mismatch with respect to the InP substrate is also usable. In this case, an increase in the degree of freedom of device design, efficient carrier confinement, and a shorter oscillation wavelength can be realized.

The quantum cascade laser according to the embodiment described above includes (1) a semiconductor substrate and (2) an active layer provided on the semiconductor substrate and having a cascade structure formed by alternately laminating quantum well emission layers and injection layers by multistage-laminating unit laminate structures each including the quantum well emission layer and the injection layer, and is configured so that (3) the unit laminate structure included in the active layer has, in its subband level structure, a first emission upper level, a second emission upper level of an energy higher than the first emission upper level, and a plurality of emission lower levels of energies lower than the first emission upper level, (4) light is generated by intersubband transitions of electrons from the first emission upper level and the second emission upper level to the plurality of emission lower levels in the quantum well emission layer, and electrons after the intersubband transitions are injected into the quantum well emission layer of the unit laminate structure of the subsequent stage via the levels in the injection layer, (5) the quantum well emission layer includes n (n is an integer of 2 or more) well layers, one of the first emission upper level and the second emission upper level is a level caused by a ground level in the first well layer closest to the injection layer side of the preceding stage, and the other is a level caused by an excitation level in a well layer except for the first well layer, and (6) the energy difference $\Delta E_{43}$ between the first emission upper level and the second emission upper level is set to be smaller than the energy of a longitudinal optical phonon, and as to a higher energy level on the higher energy side adjacent to the second emission upper level, the energy difference $\Delta E_{54}$ between the second emission upper level and the higher energy level is set to be larger than the energy of a longitudinal optical phonon.

Here, in the subband level structure of the quantum cascade laser described above, the energy interval $\Delta E_{43}$ between the first emission upper level and the second emission upper level is preferably set further within a range satisfying the following condition:

10 meV$\leq \Delta E_{43} \leq$25 meV

Accordingly, laser device characteristics such as the emission spectrum to be obtained by emission transitions from the first and second upper levels to the plurality of lower levels can be preferably set.

The energy interval $\Delta E_{54}$ between the second emission upper level and the higher energy level is preferably set within a range satisfying the following condition:

50 meV$\leq \Delta E_{54}$

Accordingly, among electrons to be injected into the first and second emission upper levels from the level in the injection layer of the preceding stage, leaking out of electrons to the level of energy higher than the emission upper level can be suppressed.

The energy interval $\Delta E_2$ between levels adjacent to each other of the plurality of emission lower levels is preferably set to be smaller than the energy of a longitudinal optical phonon ($\Delta E_2 < \Delta E_{LO}$). Even with this configuration, laser device characteristics such as the emission spectrum to be obtained by the emission transitions from the first and second upper levels to the plurality of lower levels can be preferably set. This energy interval $\Delta E_2$ is further preferably set within a range satisfying the following condition:

10 meV$\leq \Delta E_2 \leq$25 meV

Electrons from the level in the injection layer of the preceding stage to the quantum well emission layer are preferably injected into the second emission upper level. Thus, by injecting electrons into the second emission upper level on the higher energy side of the first and second emission upper levels, emission transitions from the first and second emission upper levels respectively to the emission lower levels can be preferably realized.

In both of the first emission upper level and the second emission upper level, an electron existence probability except in the first well layer of the quantum well emission layer in the active layer is preferably not less than 30%. Thus, with the configuration in which the wave functions of the first and second emission upper levels are not localized in the first well layer in the emission layer but electrons are made to exist with a sufficient probability in the second to n-th well layers as well, the first and second emission upper levels can be made to preferably function as levels for emission transitions.

The present invention is applicable as a quantum cascade laser capable of preferably obtaining emission in a broad wavelength range.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
a semiconductor substrate, and
an active layer provided on the semiconductor substrate and having a cascade structure formed by alternately laminating quantum well emission layers and injection layers by multistage-laminating unit laminate structures each including the quantum well emission layer and the injection layer, wherein
the unit laminate structure has, in its subband level structure, a first emission upper level, a second emission upper level of an energy higher than the first emission upper level, and a plurality of emission lower levels of energies lower than the first emission upper level,
light is generated by intersubband transitions of electrons from the first emission upper level and the second emission upper level to the plurality of emission lower levels in the quantum well emission layer, and electrons after the intersubband transitions are injected into the quantum well emission layer of the unit laminate structure of the subsequent stage via the level in the injection layer,
the quantum well emission layer includes n, is an integer of 2 or more, well layers, one of the first emission upper level and the second emission upper level is a level arising from a ground level in a first well layer closest to the injection layer side of the preceding stage, and the other is a level arising from an excitation level in a well layer except for the first well layer, and
an energy interval $\Delta E_{43}$ between the first emission upper level and the second emission upper level is set to be smaller than the energy of a longitudinal optical phonon, and for a higher energy level on the higher energy side adjacent to the second emission upper level, an energy interval $\Delta E_{54}$ between the second emission upper level and the higher energy level is set to be larger than the energy of a longitudinal optical phonon.

2. The quantum cascade laser according to claim 1, wherein the energy interval $\Delta E_{43}$ between the first emission upper level and the second emission upper level is set within a range satisfying the following condition.

$$10\ \text{meV} \leq \Delta E_{43} \leq 25\ \text{meV}$$

3. The quantum cascade laser according to claim 1, wherein the energy interval $\Delta E_{54}$ between the second emission upper level and the higher energy level is set within a range satisfying the following condition.

$$50\ \text{meV} \leq \Delta E_{54}$$

4. The quantum cascade laser according to claim 1, wherein an energy interval $\Delta E_2$ between levels adjacent to each other of the plurality of emission lower levels is set to be smaller than the energy of a longitudinal optical phonon.

5. The quantum cascade laser according to claim 1, wherein electrons from the level in the injection layer of the preceding stage to the quantum well emission layer are injected into the second emission upper level.

6. The quantum cascade laser according to claim 1, wherein in both of the first emission upper level and the second emission upper level, an electron existence probability except in the first well layer of the quantum well emission layer in the active layer is not less than 30%.

* * * * *

UNITED STATES PATENT AND TRADEMARK OFFICE
CERTIFICATE OF CORRECTION

PATENT NO.         : 8,514,903 B2
APPLICATION NO.    : 13/110687
DATED              : August 20, 2013
INVENTOR(S)        : Kazuue Fujita, Tadataka Edamura and Tatsuo Dougakiuchi It is certified that error appears in the above-identified patent and that said Letters Patent is hereby corrected as shown below:

In item (75) "Inventors" on the Title page of the above-identified patent, change "Tatsuo Dougakiuchi, Hamamtsu (JP)" to --Tatsuo Dougakiuchi, Hamamatsu (JP)--

Signed and Sealed this
Nineteenth Day of November, 2013

Teresa Stanek Rea
*Deputy Director of the United States Patent and Trademark Office*